(12) United States Patent
Tsai et al.

(10) Patent No.: US 7,371,617 B2
(45) Date of Patent: May 13, 2008

(54) METHOD FOR FABRICATING SEMICONDUCTOR PACKAGE WITH HEAT SINK

(75) Inventors: Ho-Yi Tsai, Taichung (TW); Chien-Ping Huang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 21 days.

(21) Appl. No.: 11/580,736

(22) Filed: Oct. 12, 2006

(65) Prior Publication Data

US 2007/0029683 A1 Feb. 8, 2007

Related U.S. Application Data

(62) Division of application No. 11/026,880, filed on Dec. 29, 2004, now Pat. No. 7,164,210.

(30) Foreign Application Priority Data

Oct. 27, 2004 (TW) .............................. 93132491 A

(51) Int. Cl.
*H01L 21/00* (2006.01)
(52) U.S. Cl. ...................... 438/124; 438/126; 438/127; 257/796; 257/787; 257/E21.05; 257/E21.08
(58) Field of Classification Search ................ 438/124, 438/126, 127; 257/E23.075, E23.131, E23.051, 257/E21.05, E21.08
See application file for complete search history.

(56) References Cited

U.S. PATENT DOCUMENTS

| 5,216,278 | A | 6/1993 | Lin et al. |
|---|---|---|---|
| 5,477,626 | A | 12/1995 | Kwon |
| 5,736,785 | A | 4/1998 | Chiang et al. |
| 6,069,027 | A * | 5/2000 | Mertol et al. ................ 438/118 |
| 6,429,512 | B1 | 8/2002 | Huang et al. |
| 6,433,420 | B1 | 8/2002 | Yang et al. |
| 6,444,498 | B1 | 9/2002 | Huang et al. |
| 6,458,626 | B1 | 10/2002 | Huang et al. |
| 6,462,405 | B1 | 10/2002 | Lai et al. |
| 6,506,681 | B2 * | 1/2003 | Grigg et al. ................ 438/692 |
| 6,522,428 | B1 | 2/2003 | Chiu et al. |
| 6,528,876 | B2 | 3/2003 | Huang |
| 2004/0212080 | A1* | 10/2004 | Chen et al. ................ 257/712 |

\* cited by examiner

*Primary Examiner*—Long K. Tran
(74) *Attorney, Agent, or Firm*—Peter F. Corless; Steven M. Jensen; Edwards Angell Palmer & Dodge LLP

(57) ABSTRACT

A semiconductor package with a heat sink and a method for fabricating the same are proposed. The heat sink is provided with a rigid and thermally resistant detach member on a top surface thereof, and is attached via its bottom surface to a chip mounted on a chip carrier. The detach member is sized larger than the heat sink and can be easily removed from the top surface of the heat sink. Subsequently, a molding process is performed to form an encapsulant for completely encapsulating the chip, the heat sink and the detach member. Then, a singulation process is performed to cut along predetermined cutting lines located between sides of the heat sink and corresponding sides of the detach member. Finally, the detach member and a portion of the encapsulant formed on the detach member are removed from the heat sink. The above fabrication method reduces the packaging cost.

13 Claims, 7 Drawing Sheets

METHOD FOR FABRICATING SEMICONDUCTOR PACKAGE WITH HEAT SINK

CROSS-REFERENCE TO RELATED APPLICATION(S)

This application is a divisional of application U.S. Ser. No. 11/026,880, filed on Dec. 29, 2004 now U.S. Pat. No. 7,164,210.

FIELD OF THE INVENTION

The present invention relates to ball grid array (BGA) semiconductor packages, and more particularly, to a BGA semiconductor package with a heat sink for improving the heat dissipating efficiency, and a method for fabricating the semiconductor package.

BACKGROUND OF THE INVENTION

A ball grid array (BGA) semiconductor package generally uses a substrate made of a resin material as a chip carrier, with a plurality of array-arranged solder balls being mounted on a bottom surface of the substrate and serving as input/output (I/O) connections for electrically connecting a chip to an external device. This makes the BGA semiconductor package have more I/O connections than a conventional lead-frame-based semiconductor package and satisfy the requirements for highly integrated chips. However, the more highly integrated the chip, the more heat would be generated. Therefore, how to effectively dissipate heat so as not to affect lifetime and reliability of the chip has become an important issue to be addressed.

In order to solve the foregoing problem of heat dissipation, U.S. Pat. No. 5,216,278 has disclosed a semiconductor package with a heat sink being directly attached to a chip and exposed from an encapsulant. As the heat sink is mounted right on the chip, heat generated by the chip can be directly dissipated to the atmosphere via an exposed surface of the heat sink, thereby effectively dissipating the heat from the chip.

Referring to FIG. 9, however, during a molding process for the semiconductor package disclosed by U.S. Pat. No. 5,216,278, a distance H between a top surface 10' of a heat sink 1' and an upper surface 30' of a substrate 3' mounted with a chip 2' needs to be equal to a depth h' of a molding cavity 40' of a mold 4'. This is to ensure that the top surface 10' of the heat sink 1' would be exposed from the encapsulant 5' and not have resin flashes thereon after the molding process, as well as the chip 2' would not be cracked by pressure from the heat sink 1'. In other words, if the distance H between the top surface 10' of the heat sink 1' and the upper surface 30' of the substrate 3' is larger than the depth h' of the molding cavity 40', during the molding process, the mold 4' would unduly press the heat sink 1' and cause cracks of the chip 2' that is directly attached by the heat sink 1'. On the contrary, if the distance H between the top surface 10' of the heat sink 1' and the upper surface 30' of the substrate 3' is smaller than the depth h' of the molding cavity 40', a resin material used for forming the encapsulant 5' would flash over the top surface 10' of the heat sink 1'. The resin flashes not only impair an appearance of a fabricated product but also reduce an area of the top surface 10' of the heat sink 1' exposed to the atmosphere, thereby deteriorating the heat dissipating efficiency. As a result, an additional deflash process is usually performed to remove the resin flashes on the top surface 10' of the heat sink 1'. However, the deflash process complicates the overall fabrication processes of the semiconductor package and also increases the cost.

Moreover, in order to make the distance H between the top surface 10' of the heat sink 1' and the upper surface 30' of the substrate 3' equal to the depth h' of the molding cavity 40', the attachment between the heat sink 1' and the chip 2', the attachment between the chip 2' and the substrate 3', and the thickness of the heat sink 1' all need to be precisely controlled and performed. However, such requirement of preciseness increases the packaging cost and also complicates the fabrication processes, and is thus difficult to be achieved in practice.

U.S. Pat. Nos. 5,736,785 and 5,477,626 have also disclosed similar semiconductor packages, which thus have the foregoing problems to be solved.

In order to prevent cracks of the chip due to pressure from the heat sink and to reduce the requirement of preciseness in fabrication, U.S. Pat. Nos. 6,522,428, 6,528,876, 6,462,405, 6,429,512 and 6,433,420 have respectively proposed a semiconductor package with a heat sink not in contact with a chip. The heat sink of this semiconductor package comprises a plurality of supporting portions attached to a substrate and a flat portion supported above the chip by the supporting portions, such that an appropriate gap is formed between the chip and the flat portion of the heat sink and is filled with an encapsulating resin. Since the chip is not in contact with the heat sink, heat generated by the chip cannot be directly transferred to the heat sink but must be transmitted by the encapsulating resin that has poor thermal conductivity. As a result, the heat dissipating efficiency would be adversely affected in the case of the heat from the chip being transferred via the encapsulating resin to the heat sink, such that the reliability and lifetime of the semiconductor package are also degraded in accordance with the unsatisfactory heat dissipating efficiency.

In order to resolve the drawback of the foregoing semiconductor package caused by no direct contact between the heat sink and the chip, U.S. Pat. Nos. 6,458,626 and 6,444,498 (having the same assignee as that of the present invention) have disclosed a semiconductor package with a heat sink being directly attached to a chip without leading to cracks of the chip or resin flashes on an exposed surface of the heat sink. Referring to FIG. 10, in this semiconductor package, a material layer 5" is formed on a surface of a heat sink 1" to be exposed to the atmosphere, wherein the material layer 5" has poor adhesion with an encapsulating resin or the heat sink 1". Then, the heat sink 1" is attached to a chip 2" mounted on a substrate 3". Referring to FIG. 11, a molding process is performed to allow the encapsulating resin 4" to completely encapsulate the heat sink 1" and the chip 2" and cover the material layer 5" on the heat sink 1". In other words, the depth of a molding cavity of a mold (not shown) used in the molding process is larger than a combined thickness of the chip 2" and the heat sink 1". Therefore, during the molding process, the mold would not come into contact with the heat sink 1" and thus prevents the chip 2" from being pressed and cracked. Furthermore, referring to FIG. 12, a singulation process is performed to cut off redundant portions and form individual semiconductor package units. Finally, referring to FIG. 13A, the encapsulating resin 4" formed on the heat sink 1" is removed. If the adhesion between the material layer 5" and the heat sink 1" is larger than that between the material layer 5" and the encapsulating resin 4", the material layer 5" remains on the heat sink 1" after the resin 4" is removed from the material layer 5", and no flash of the resin 4" is left on the heat sink 1" by virtue of the poor adhesion between the material layer 5" and the resin 4". Referring to FIG. 13B, if the adhesion between the material layer 5" and the heat sink 1" is smaller than that between the material layer 5" and the encapsulating resin 4", the material layer 5" would be relatively more strongly attached to the resin 4" and removed along with the resin 4", such that no resin flash occurs on the heat sink 1".

Although the foregoing semiconductor package in U.S. Pat. Nos. 6,458,626 and 6,444,498 does not have the problems of chip cracks and resin flashes on the heat sink, during the singulation process shown in FIG. 12, a cutting tool needs to cut the heat sink made of a metal material (usually copper) and is worn easily, making the packaging cost undesirably increased. Also, burrs are usually incurred at cutting sides of the heat sink exposed to the atmosphere after the singulation process and thus impair an appearance of a fabricated product. If the sides of the heat sink with burrs are subjected to a polishing process, the cost would be further increased and the fabrication processes would become more complicated.

Moreover, in U.S. Pat. No. 6,444,498, a polyimide tape is used and attached to the heat sink, such that after the singulation process, the encapsulation resin cured on the tape can be easily removed along with the tape from the heat sink, and no resin flash is left on the surface of the heat sink exposed to the atmosphere. However, although the use of polyimide tape provides a desirable advantage in U.S. Pat. No. 6,444,498, the polyimide tape is expensive and thus increases the overall cost of the fabrication processes.

Therefore, the problem to be solved here is to provide a semiconductor package with a heat sink, which can eliminate the above drawbacks in the prior art.

SUMMARY OF THE INVENTION

In light of the above prior-art drawbacks, a primary objective of the present invention is to provide a method for fabricating a semiconductor package with a heat sink, so as to reduce wear of a cutting tool and the overall packaging cost.

Another objective of the present invention is to provide a method for fabricating a semiconductor package with a heat sink, which does not require an expensive polyimide tape and thus can reduce the packaging cost.

Still another objective of the present invention is to provide a method for fabricating a semiconductor package with a heat sink, which can prevent cracks of a chip and occurrence of resin flashes.

A further objective of the present invention is to provide a semiconductor package with a heat sink, which has the reduced fabrication cost and avoids the use of a polyimide tape.

In accordance with the above and other objectives, the present invention proposes a method for fabricating a semiconductor package with a heat sink, comprising the steps of: mounting a detach member, a heat sink and a chip on a chip carrier in a manner that the heat sink is disposed between the detach member and the chip, and the chip is disposed between the heat sink and the chip carrier, wherein the chip is electrically connected to the chip carrier, and the detach member is sized larger than the heat sink and can be easily removed from the heat sink; then, forming an encapsulant on the chip carrier to encapsulate the detach member, the heat sink and the chip; subsequently, performing a singulation process to cut along predetermined cutting lines located between sides of the heat sink and corresponding sides of the detach member so as to remove portions of the encapsulant, the chip carrier and the detach member that are located outside the predetermined cutting lines; and finally, removing the detach member and a portion of the encapsulant formed on the detach member from the heat sink, such that a top surface of the heat sink is exposed from the encapsulant.

The detach member can be made of a discarded material such as a resin substrate e.g. FR4 resin, a glass fiber plate, a ceramic plate, or any other plate that is made of a thermally resistant and rigid material. The detach member is cheap and does not easily cause wear of a cutting tool. Thus, the present invention requires lower cost than the conventional fabrication method disclosed in U.S. Pat. Nos. 6,444,498 and 6,458,626 using a cutting tool to directly cut a metal heat sink.

Furthermore, the detach member is attached to the heat sink via an adhesive layer. In order to easily remove the detach member and the adhesive layer from the heat sink without any residue of the adhesive layer remaining on the heat sink and to ensure no resin flash being formed on the top surface of the heat sink, the adhesive layer must be made of a material that has greater adhesion with the detach member than with the heat sink. Additionally, for further facilitating the removal of the detach member and the adhesive layer from the heat sink, the top surface of the heat sink can be in advance plated with a metal layer such as chromium, nickel, gold, or an alloy thereof, etc., or alternatively the top surface of the heat sink can be coated by for example wax or oil that is easily removable, such that the adhesion between the heat sink and the adhesive layer would be further reduced.

In order to reinforce the bonding strength between the heat sink and the encapsulant and prevent delamination at a bonding interface therebetween, the periphery of the heat sink can be formed with a stepped structure to increase a bonding area between the encapsulant and the heat sink and provide an anchoring effect. Alternatively, any other conventional methods for enhancing the bonding strength between the heat sink and the encapsulant are all applicable.

The present invention also proposes a semiconductor package with a heat sink, comprising: at least one chip; a chip carrier to which the chip is mounted and electrically connected; a heat sink directly attached to the chip; and an encapsulant for encapsulating the chip and a portion of the heat sink, wherein a top surface of the heat sink is exposed from the encapsulant, and a distance is present between a side of the heat sink and a corresponding side of the encapsulant. Further, each side of the encapsulant is coplanar with each corresponding side of the chip carrier.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE
PREFERRED EMBODIMENTS

First Preferred Embodiment

FIGS. 1A to 1D are cross-sectional views showing a method for fabricating a semiconductor package with a heat sink according to a first preferred embodiment of the present invention.

Figure 1A:
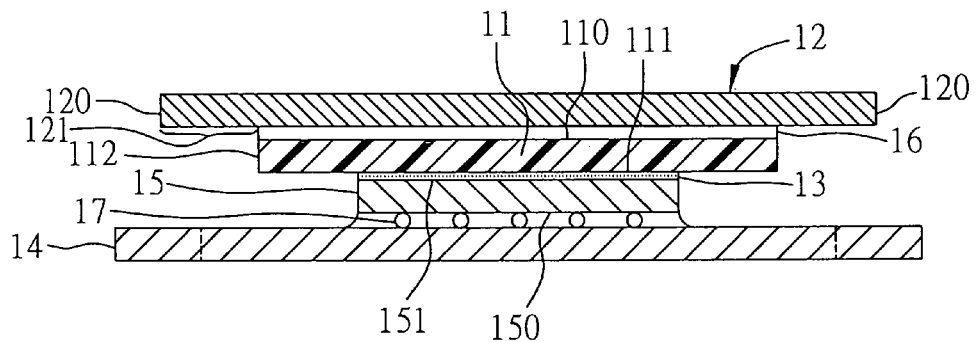
FIGS. 1A to 1D are cross-sectional views showing a method for fabricating a semiconductor package with a heat sink according to a first preferred embodiment of the present invention.

Referring to FIG. 1A, a heat sink 11 provided with a detach member 12 thereon is attached via an adhesive 13 to a chip 15 mounted on an upper surface of a substrate 14.

The heat sink 11 is made of a metal material such as copper, aluminum, or an alloy thereof, etc., and has a top surface 110 and an opposed bottom surface 111. The detach member 12 is attached to the top surface 110 of the heat sink 11 via an adhesive layer 16. The adhesive layer 16 is made of a material that allows adhesion between the adhesive layer 16 and the detach member 12 to be larger than that between the adhesive layer 16 and the heat sink 11, such that subsequently the detach member 12 can be successfully removed from the top surface 110 of the heat sink 11 and no residue of the adhesive layer 16 would remain on the top surface 110 of the heat sink 11. In order to further reduce the adhesion between the adhesive layer 16 and the heat sink 11, the top surface 110 of the heat sink 11 can be in advance plated with a metal layer (not shown) such as chromium, nickel, gold, or an alloy thereof, etc. to enhance detachability between the heat sink 11 and the detach member 12. Alternatively, the top surface 110 of the heat sink 11 can be coated with a medium layer to similarly diminish the adhesion between the adhesive layer 16 and the heat sink 11; for example, the top surface 110 of the heat sink 11 can be coated by oil or wax.

Generally, the detach member 12 is made of a discarded or defective substrate or circuit board to reduce the material cost, such as a FR4 substrate, a resin plate, a glass fiber plate, or a ceramic plate. The detach member 12 must be sized larger than the heat sink 11, such that when the heat sink 11 is attached to the detach member 12, each side 112 of the heat sink 11 is spaced from each corresponding side 120 of the detach member 12 by a predetermined distance, and the heat sink 11 is completely covered by the detach member 12.

Moreover, when using the discarded or defective substrate as the detach member 12, a copper foil layer (known in the art and not shown) formed on a bottom surface of the substrate is retained; that is, preferably a single-layer substrate structure (a combination of a resin core layer and a copper foil layer) is used. Since adhesion between the copper foil layer and an encapsulant (shown in FIG. 1B) subsequently formed for encapsulating the chip 15 and the heat sink 11 is smaller than that between the copper foil layer and the resin core layer, although an area 121 of the detach member 12 not coated with the adhesive layer 16 is directly in contact with the encapsulant, this area 121 can still be easily separated from the encapsulant when removing the detach member 12 from the heat sink 11 and the encapsulant due to the poor adhesion between the encapsulant and the copper foil layer on the bottom surface of the detach member 12. On the other hand, in the case that the copper foil layer has been removed or is not present on the bottom surface of the substrate, in order to enhance the detachability between the area 121 of the detach member 12 and the encapsulant, this area 121 can be found with a metal layer such as gold or any other suitable found layer capable of reducing the adhesion between the area 121 and the encapsulant.

Furthermore, due to a difference in characteristics of materials of the detach member 12 and the heat sink 11, the adhesive layer 16 used for attaching the detach member 12 to the heat sink 11 generally has greater adhesion with the detach member 12 than with the heat sink 11. Also, the top surface 110 of the heat sink 11 would not come into contact with the encapsulant formed in a subsequent molding process for encapsulating the chip 15 and the heat sink 11. Thus, an expensive polyimide resin tape is not required on the top surface 110 of the heat sink 11 (unlike the disclosure of U.S. Pat. No. 6,444,498 described in Background of the Invention), thereby reducing the packaging cost in the present invention.

Additionally, the attachment of the heat sink 11 and the detach member 12 is performed by a known technique, which is thus not to be further described here.

The chip 15 is mounted on and electrically connected to the substrate 14 via a plurality of solder bumps 17, which forms a conventional flip-chip structure. In other words, an active surface 150 of the chip 15 faces the substrate 14 and is electrically connected to the substrate 14 via the solder bumps 17. A non-active surface 151 of the chip 15 faces the heat sink 11, and the bottom surface 111 of the heat sink 11 is attached to the non-active surface 151 of the chip 15 via the adhesive 13.

The substrate 14 is a general substrate for a ball gird array (BGA) package. The substrate 14 can be made of such as epoxy resin, polyimide resin, triazine resin, phenol resin, glass fiber, or ceramic material, etc., and is preferably a FR4 or BT (bismaleimide triazine) substrate.

Figure 1B:
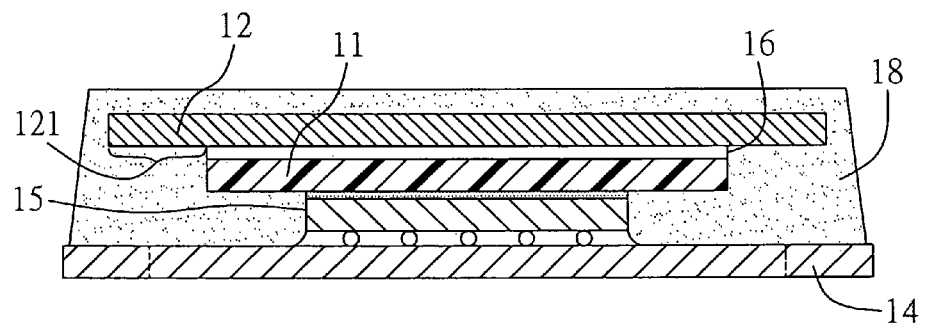

Subsequently, referring to FIG. 1B, the substrate 14 mounted with the chip 15, the heat sink 11 and the detach member 12 thereon is placed into an encapsulating mold (not shown) for performing a molding process, so as to form an encapsulant 18 on the substrate 14 to completely encapsulate the chip 15, the heat sink 11 and the detach member 12.

The molding process, the encapsulating mold and an encapsulating resin used for forming the encapsulant 18 are all known in the art and thus not to be further detailed here. It should be noted that the encapsulant 18 can completely encapsulate the detach member 12. In other words, the encapsulating mold does not press or contact the detach member 12 during the molding process, thereby preventing the chip 15 from being pressed and cracked.

Figure 1C:
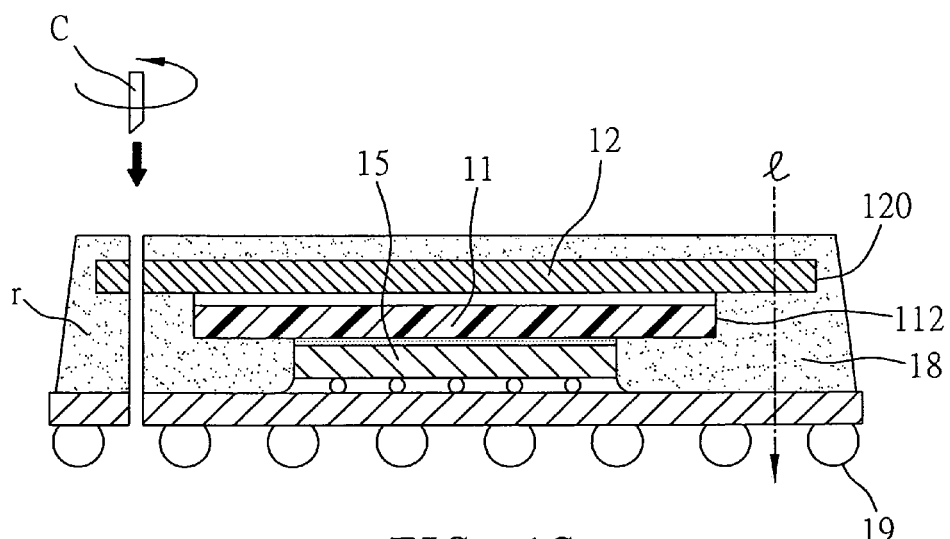

Referring to FIG. 1C, after the encapsulant 18 is cured and the encapsulating mold is removed to complete the molding process, a plurality of array-arranged solder balls 19 are implanted on a lower surface of the substrate 14, such that the chip 15 can be electrically connected to an external electronic device such as a printed circuit board via the solder balls 19. Then, a singulation process is performed in which a cutting tool c cuts along predetermined cutting lines 1 located between the sides 112 of the heat sink 11 and the corresponding sides 120 of the detach member 12 such that a redundant part r comprising portions of the substrate 14, the encapsulant 18 and the detach member 12 that are located outside the predetermined cutting lines 1 is removed from the singulated semiconductor package.

During the singulation process, the cutting tool c does not contact or cut the metal-made heat sink 11. Therefore, compared to the previously described U.S. Pat. No. 6,444, 498 using a cutting tool to directly cut a metal heat sink and thus causing quick wear of the cutting tool and increase in the packaging cost, the fabrication method in the present invention reduces wear of the cutting tool c and is more cost-effective than the conventional technology.

Figure 1D:
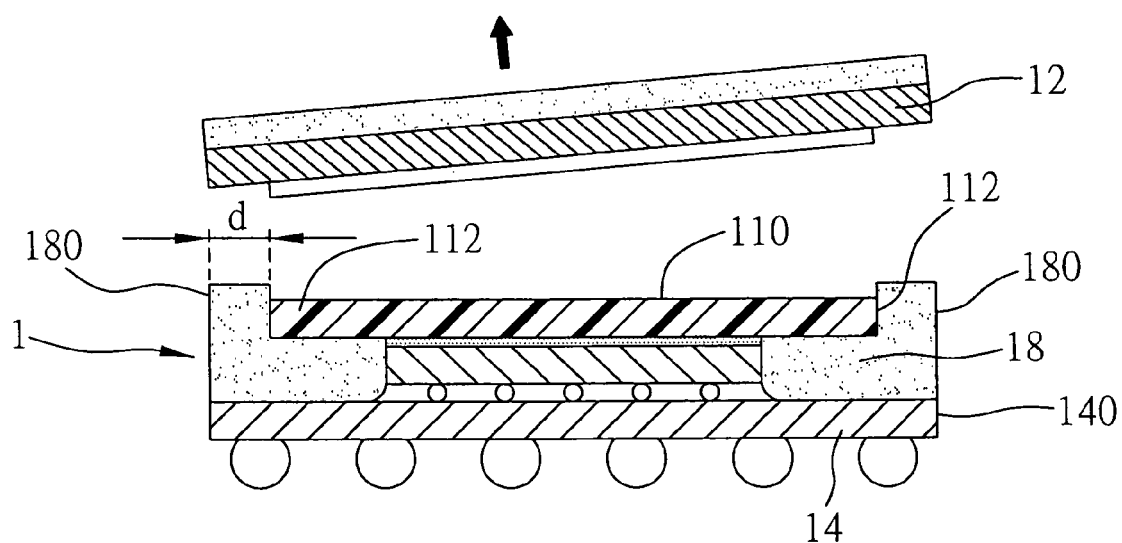

Referring to FIG. 1D, the detach member 12 and a portion of the encapsulant 18 formed on the detach member 12 are removed form the heat sink 11 and a portion of the encapsulant 18 located underneath the detach member 12, such that the top surface 110 of the heat sink 11 is exposed to the atmosphere. As described above, since the adhesion between the detach member 12 and the adhesive layer 16 for attaching the heat sink 11 to the detach member 12 is larger than that between the adhesive layer 16 and the heat sink 11, the adhesive layer 16 can be successfully removed along with the detach member 12 from the top surface 110 of the heat sink 11. Thus, the top surface 110 of the heat sink 11 can be completely exposed to the atmosphere without having any resin flash since the top surface 110 of the heat sink 11 is earlier completely covered by the detach member 12 and not in contact with the encapsulant 18. After the detach member 12 and the portion of encapsulant 18 formed thereon are removed from the heat sink 11 and the portion of encapsulant 18 located underneath the detach member 12, the fabrication method according to the first embodiment of the present invention is complete.

In the above fabricated semiconductor package 1, as the sides 112 and the bottom surface 111 of the heat sink 11 are all bonded to the encapsulant 18, making delamination not easily occur between the heat sink 11 and the encapsulant 18. On the contrary, in the semiconductor package of the previously described U.S. Pat. No. 6,444,498, a top surface and sides of a heat sink are all exposed from an encapsulant, and only a bottom surface of the heat sink is bonded to the encapsulant, such that during a temperature cycle of the semiconductor package, a problem of delamination at an interface between the heat sink and the encapsulant may be caused due to mismatch in coefficient of thermal expansion (CTE) between the heat sink and the encapsulant.

Furthermore, the fabrication method disclosed in U.S. Pat. No. 6,444,498 needs to cut the heat sink, such that the cutting sides of the heat sink are exposed from the encapsulant after a singulation process. However, burrs are often incurred at the cutting sides of the heat sink, and thus an appearance of a fabricated product is impaired. If the sides of the heat sink with burrs are subjected to a polishing process, the packaging cost and the fabrication processes would both be increased. On the contrary, in the fabrication method according to the first embodiment of the present invention, the cutting tool does not cut the heat sink 11 during the singulation process, and the sides 112 of the heat sink 11 are completely encapsulated by the encapsulant 18, such that a post treatment is not required and there is no concern of impairing an appearance of a fabricated product.

Particularly, in the fabricated semiconductor package 1, only the top surface 110 of the heat sink 11 is exposed from the encapsulant 18, and sides 180 of the encapsulant 18 are coplanar with corresponding sides 140 of the substrate 14, such that a distance d is formed between the sides 112 of the heat sink 11 and the corresponding sides 180 of the encapsulant 18 as shown in FIG. 1D.

The structure and fabrication method of semiconductor packages according to second to eighth preferred embodiments are described as follows and similar to those in the first embodiment. Only structural differences between the semiconductor packages of the second to eighth embodiments and the semiconductor package 1 of the first embodiment are discussed below, and differences in the fabrication method can be understood by a person having ordinary skill in the art according to the structural differences, such that the fabrication method would not be further discussed in the following second to eighth embodiments.

Second Preferred Embodiment

Figure 2:
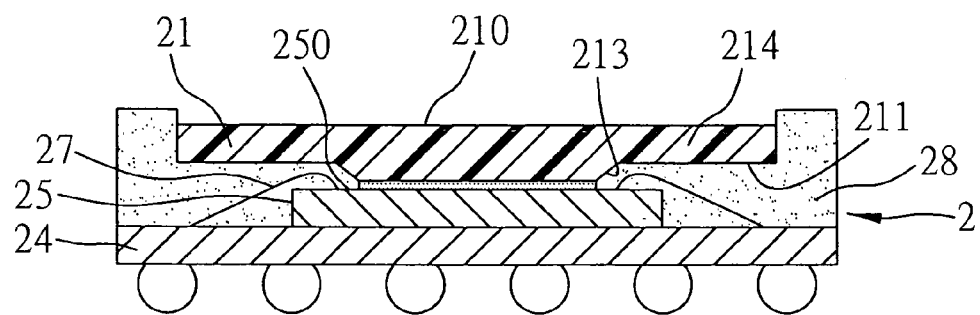
FIG. 2 is a cross-sectional view of a semiconductor package with a heat sink according to a second preferred embodiment of the present invention.

FIG. 2 shows a semiconductor package with a heat sink according to a second preferred embodiment of the present invention.

In the semiconductor package 2 of the second embodiment, a chip 25 is electrically connected to a substrate 24 via a plurality of gold wires 27. As wire loops of the gold wires 27 are higher than an active surface 250 of the chip 25, an extension portion 213 is formed on a bottom surface 211 of a heat sink 21, and the heat sink 21 is directly attached to the active surface 250 of the chip 25 via the extension portion 213. A flat portion 214 of the heat sink 21 is supported above the chip 25 by the extension portion 213. And a top surface 210 of the heat sink 21 is exposed from an encapsulant 28 after the encapsulant 28 is cured.

Third Preferred Embodiment

Figure 3:
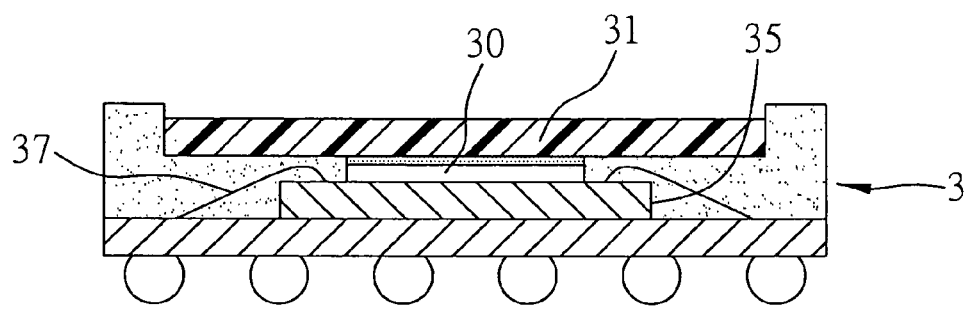
FIG. 3 is a cross-sectional view of a semiconductor package with a heat sink according to a third preferred embodiment of the present invention.

FIG. 3 shows a semiconductor package with a heat sink according to a third preferred embodiment of the present invention.

A heat sink 31 used in the semiconductor package 3 of the third embodiment is the same as that in the semiconductor package 1 of the first embodiment and has a flat structure. However, in this embodiment, in order to support the heat sink 31 above a chip 35 and prevent the heat sink 31 from contacting gold wires 37, a pad 30 is disposed between the heat sink 31 and the chip 35. As the pad 30 is made of a semiconductor material or a material similar to the semiconductor material, heat generated by the chip 35 can still be effectively transmitted to the heat sink 31 via the pad 30 and directly dissipated to the atmosphere via the heat sink 31. The pad 30 is preferably made of a discarded chip.

Fourth Preferred Embodiment

Figure 4:
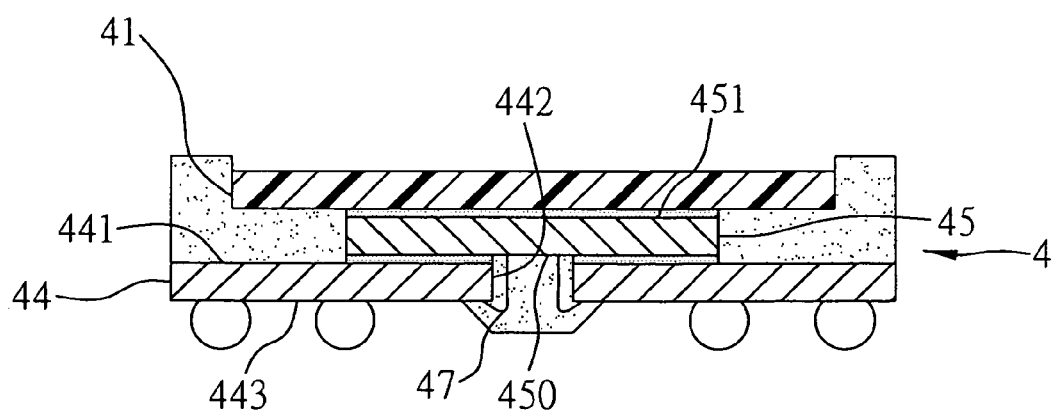
FIG. 4 is a cross-sectional view of a semiconductor package with a heat sink according to a fourth preferred embodiment of the present invention.

FIG. 4 shows a semiconductor package with a heat sink according to a fourth preferred embodiment of the present invention.

The semiconductor package 4 of the fourth embodiment has a cavity-down structure. In particular, an active surface 450 of a chip 45 faces downwardly and a non-active surface 451 of the chip 45 faces upwardly, such that the chip 45 is mounted via its active surface 450 on an upper surface 441 of a substrate 44. The active surface 450 of the chip 45 covers an opening 442 through the substrate 44, and the chip 45 can be electrically connected to a lower surface 443 of the substrate 44 via gold wires 47 passing through the opening 442. Moreover, a heat sink 41 is attached to the non-active surface 451 of the chip 45.

Fifth Preferred Embodiment

Figure 5:
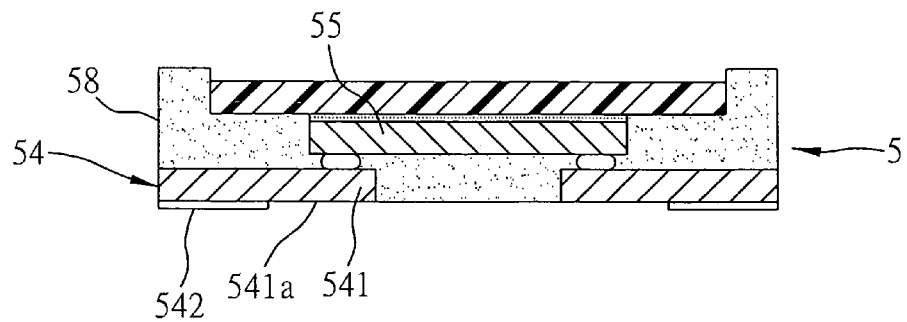
FIG. 5 is a cross-sectional view of a semiconductor package with a heat sink according to a fifth preferred embodiment of the present invention.

FIG. 5 shows a semiconductor package with a heat sink according to a fifth preferred embodiment of the present invention.

In the semiconductor package 5 of the fifth embodiment, a chip 55 is electrically connected via solder bumps 57 to leads 541 of a quad flat non-leaded (QFN) lead frame 54 free of a die pad. After forming an encapsulant 58, a bottom surface 541*a* of each of the leads 541 of the lead frame 54 is exposed from the encapsulant 58, such that the chip 55 can be electrically connected to an external device by means of a conductive pad 542 formed on the bottom surface 541*a* of each of the leads 541.

Sixth Preferred Embodiment

Figure 6:
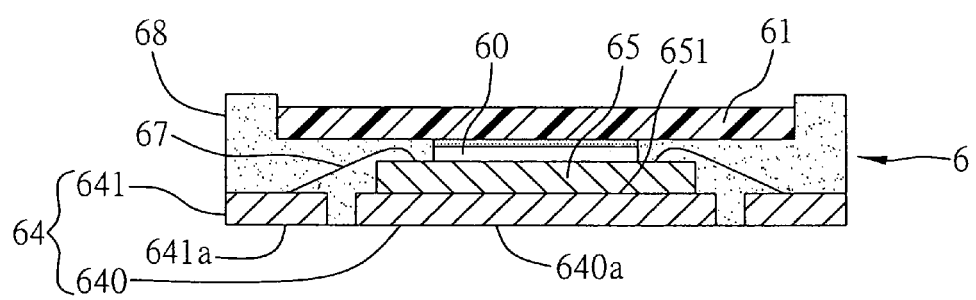
FIG. 6 is a cross-sectional view of a semiconductor package with a heat sink according to a sixth preferred embodiment of the present invention.

FIG. 6 shows a semiconductor package with a heat sink according to a sixth preferred embodiment of the present invention.

In the semiconductor package 6 of the sixth embodiment, a QFN lead frame 64 is used as a carrier for a chip 65, and comprises a die pad 640 and a plurality of leads 641. The chip 65 is mounted via its non-active surface 651 on the die pad 640 and is electrically connected to the leads 641 by a plurality of gold wires 67. After forming an encapsulant 68, a bottom surface 640*a* of the die pad 640 and a bottom surface 641*a* of each of the leads 641 are exposed from the encapsulant 68. A heat sink 61 is attached to the chip 65 via a pad 60. The pad 60 is preferably made of a discarded chip or a material similar to a chip material, such that the pad 60 would have a same or similar CTE as or to that of the chip 65 so as to prevent the pad 60 from exerting a thermal stress effect on the chip 65.

Seventh Preferred Embodiment

Figure 7:
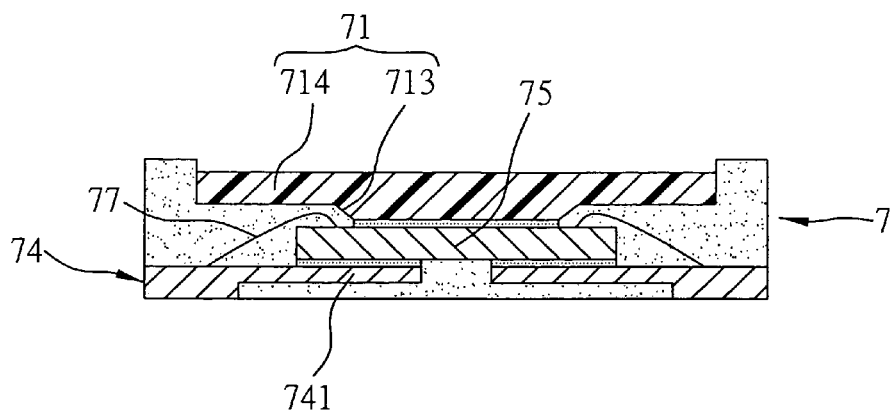
FIG. 7 is a cross-sectional view of a semiconductor package with a heat sink according to a seventh preferred embodiment of the present invention.

FIG. 7 shows a semiconductor package with a heat sink according to a seventh preferred embodiment of the present invention.

In the semiconductor package 7 of the seventh embodiment, a chip 75 is mounted on a QFN lead frame 74 comprising a plurality of leads 741 (free of a die pad) and is electrically connected to the leads 741 via a plurality of gold wires 77. A heat sink 71 comprising a flat portion 714 and an extension portion 713 extended from the flat portion 714 is attached to the chip 75 via the extension portion 713, such that the flat portion 714 is supported above the chip 75 by the extension portion 713 to prevent contact between the gold wires 77 and the heat sink 71.

Eighth Preferred Embodiment

Figure 8:
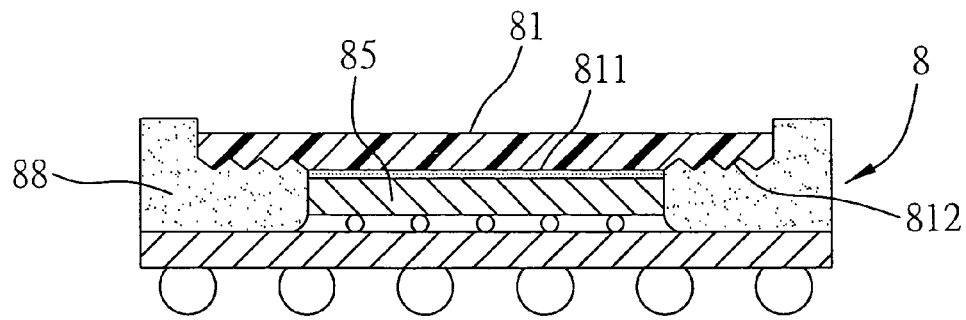
FIG. 8 is a cross-sectional view of a semiconductor package with a heat sink according to an eighth preferred embodiment of the present invention.
Figure 9:
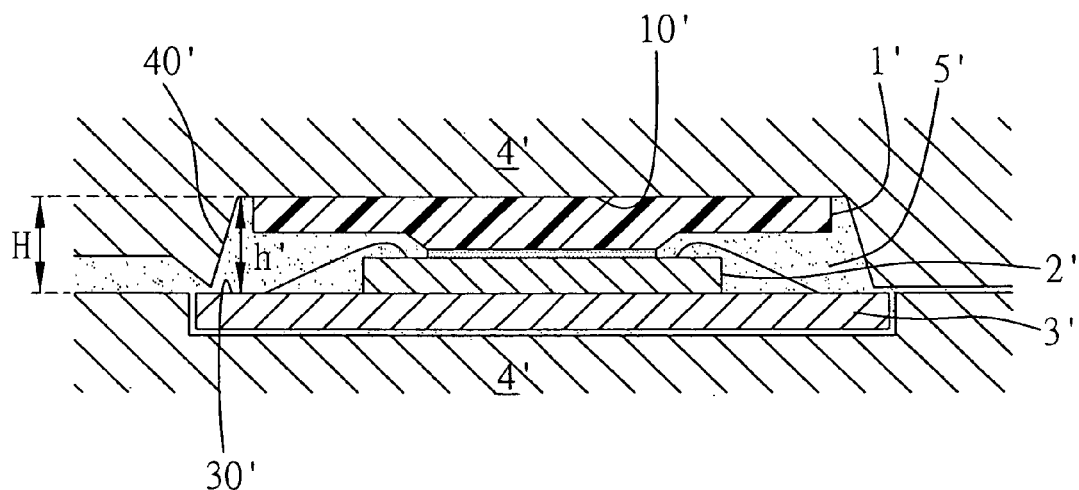
FIG. 9 (PRIOR ART) is a cross-sectional view of a semiconductor package according to U.S. Pat. No. 5,216,278.
Figure 10:
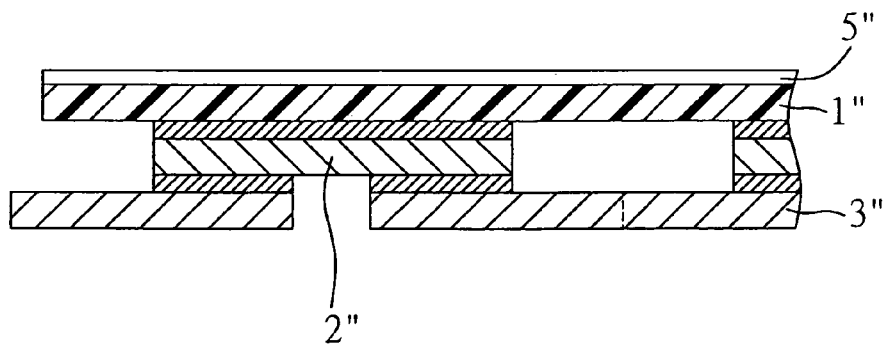
FIG. 10 (PRIOR ART) is a cross-sectional view showing a heat sink being directly attached to a chip according to U.S. Pat. Nos. 6,458,626 and 6,444,498.
Figure 11:
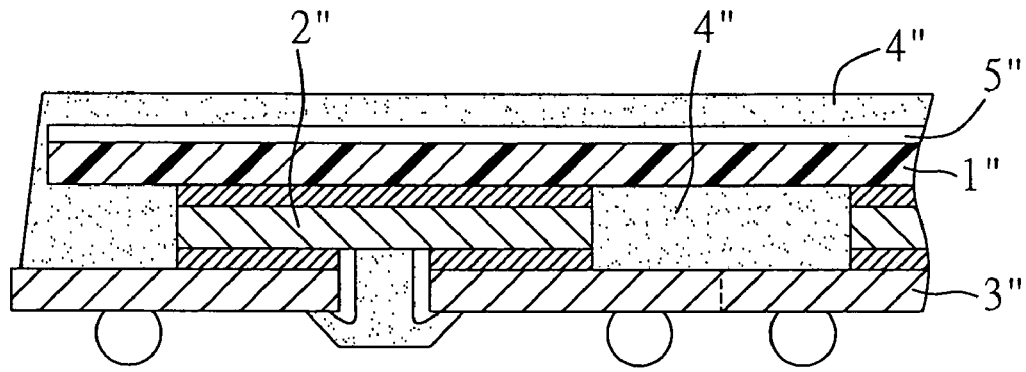
FIG. 11 (PRIOR ART) is a cross-sectional view showing a molding process according to U.S. Pat. Nos. 6,458,626 and 6,444,498.
Figure 12:
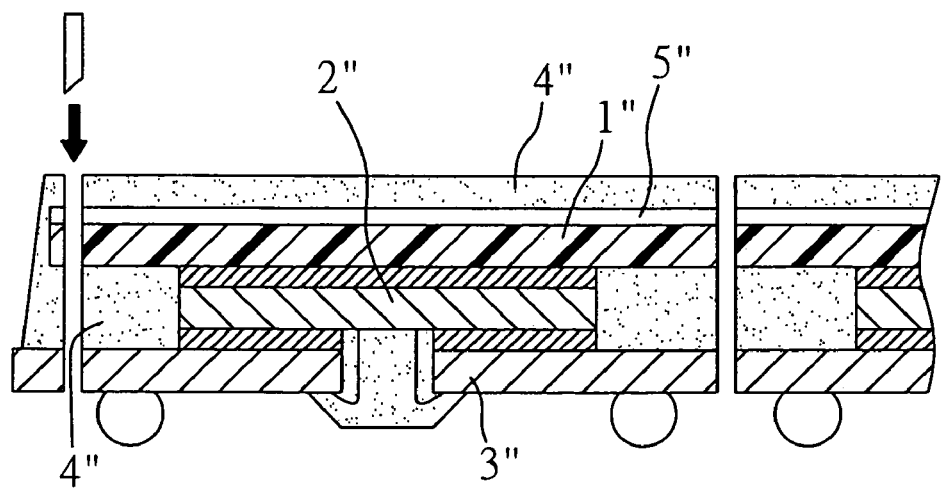
FIG. 12 (PRIOR ART) is a cross-sectional view showing a singulation process according to U.S. Pat. Nos. 6,458,626 and 6,444,498.
Figure 13A:
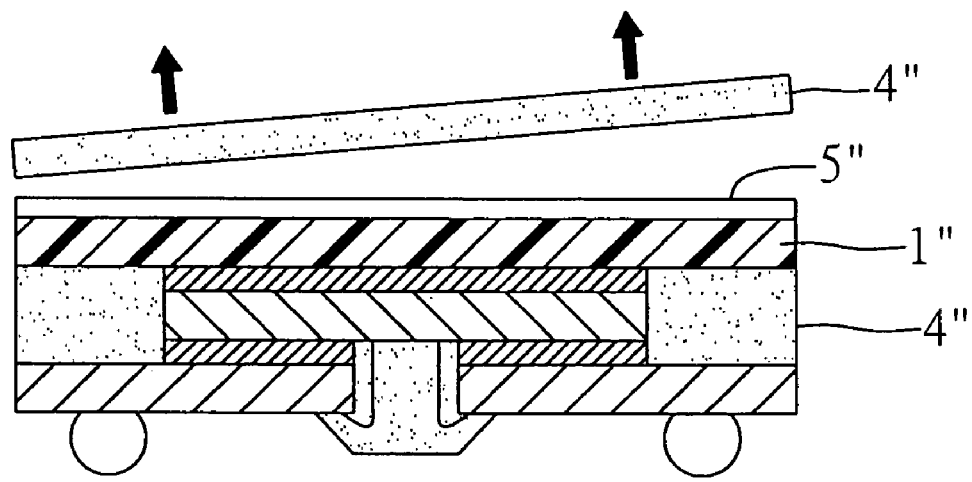
FIGS. 13A and 13B (PRIOR ART) are cross-sectional views showing removal of an encapsulating resin formed on the heat sink according to U.S. Pat. Nos. 6,458,626 and 6,444,498.
Figure 13B:
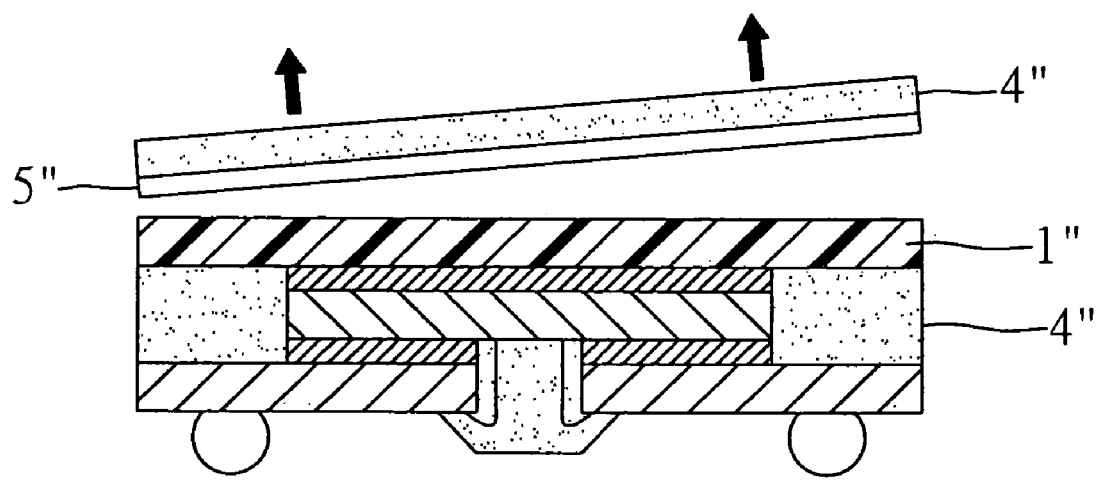

FIG. 8 shows a semiconductor package with a heat sink according to an eighth preferred embodiment of the present invention.

The semiconductor package 8 of the eighth embodiment comprises a heat sink 81 attached to a chip 85. A corrugated portion 812 is formed on a bottom surface 811 of the heat sink 81 to increase adhesion between the heat sink 81 and an encapsulant 88 for encapsulating the chip 85, so as to prevent delamination between the heat sink 81 and the encapsulant 88. Alternatively, the corrugated portion can be replaced by any other structure able to increase the contact area between the heat sink 81 and the encapsulant 88; for example, the bottom surface 811 of the heat sink 81 can be roughened or formed with a stepped portion, etc.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a semiconductor package with a heat sink, comprising the steps of:
   mounting a detach member, a heat sink and a chip on a chip carrier, wherein the heat sink is disposed between the detach member and the chip, and the chip is disposed between the heat sink and the chip carrier, and wherein the detach member is sized larger than the heat sink and is removable from the heat sink;
   forming an encapsulant on the chip carrier to completely encapsulate the detach member, the heat sink and the chip;
   cutting along predetermined cutting lines located between sides of the detach member and corresponding sides of the heat sink so as to remove portions of the detach member, the encapsulant and the chip carrier that are located outside the predetermined cutting lines; and
   separating the detach member and a portion of the encapsulant formed on the detach member from the heat sink and the rest of the encapsulant, such that a top surface of the heat sink is exposed to the atmosphere.

2. The method of claim 1, wherein the heat sink is attached to the detach member via an adhesive layer, and adhesion between the adhesive layer and the detach member is larger than that between the adhesive layer and the heat sink, such that the adhesive layer is removed along with the detach member from the heat sink and does not remain on the heat sink.

3. The method of claim 1, wherein a metal layer is formed on the top surface of the heat sink.

4. The method of claim 3, wherein the metal layer is made of a material selected from the group consisting of chromium, nickel, gold, and an alloy thereof.

5. The method of claim 1, wherein a medium layer is formed on the top surface of the heat sink.

6. The method of claim 5, wherein the medium layer is made of wax or oil.

7. The method of claim 1, wherein the detach member comprises a discarded circuit board.

8. The method of claim 1, wherein the detach member is made of a material selected from the group consisting of resin, glass fiber, and ceramics.

9. The method of claim 1, wherein the chip carrier is a substrate.

10. The method of claim 1, wherein the chip carrier is a lead frame.

11. The method of claim 1, wherein a corrugated portion is formed on a bottom surface of the heat sink.

12. The method of claim 1, wherein a stepped portion is formed on a bottom surface of the heat sink.

13. The method of claim 1, wherein a bottom surface of the heat sink is roughened.

* * * * *